United States Patent
Hayashizaki et al.

(10) Patent No.: US 12,000,867 B2
(45) Date of Patent: Jun. 4, 2024

(54) ELECTRICAL CONNECTING DEVICE

(71) Applicant: Kabushiki Kaisha Nihon Micronics, Tokyo (JP)

(72) Inventors: Takayuki Hayashizaki, Aomori (JP); Akihisa Akahira, Oita (JP); Hisao Narita, Aomori (JP); Mizuho Kon, Oita (JP); Kenichi Suto, Aomori (JP)

(73) Assignee: Kabushiki Kaisha Nihon Micronics, Musashino (JP)

( * ) Notice: Subject to any disclaimer, the term of this patent is extended or adjusted under 35 U.S.C. 154(b) by 298 days.

(21) Appl. No.: 17/436,564

(22) PCT Filed: Feb. 27, 2020

(86) PCT No.: PCT/JP2020/007947
§ 371 (c)(1),
(2) Date: Sep. 3, 2021

(87) PCT Pub. No.: WO2020/179596
PCT Pub. Date: Sep. 10, 2020

(65) Prior Publication Data
US 2022/0146553 A1 May 12, 2022

(30) Foreign Application Priority Data
Mar. 6, 2019 (JP) ................. 2019-040144

(51) Int. Cl.
*G01R 1/073* (2006.01)
*G01R 1/067* (2006.01)

(52) U.S. Cl.
CPC ...... *G01R 1/07357* (2013.01); *G01R 1/06711* (2013.01)

(58) Field of Classification Search
CPC ............ G01R 1/06755; G01R 1/06711; G01R 1/06733; G01R 1/07371; G01R 1/07357
See application file for complete search history.

(56) References Cited

U.S. PATENT DOCUMENTS

| | | | |
|---|---|---|---|
| 5,952,843 A * | 9/1999 | Vinh | G01R 1/07357 324/754.07 |
| 2012/0286816 A1 | 11/2012 | Kister | |

(Continued)

FOREIGN PATENT DOCUMENTS

| | | |
|---|---|---|
| JP | 2014001997 A | 1/2014 |
| JP | 2015118064 A | 6/2015 |

(Continued)

OTHER PUBLICATIONS

Narita et al_JP2018004260A_MachineTranslation_2018_01_11 (Year: 2018).*

Primary Examiner — Jermele M Hollington
Assistant Examiner — Suresh K Rajaputra
(74) Attorney, Agent, or Firm — Lorenz & Kopf, LLP

(57) ABSTRACT

An electrical connecting device includes probes, and a probe head including a middle guide plate arranged between a top guide plate and a bottom guide plate and closer to the bottom guide plate so as to lead the probes to penetrate therethrough. The top guide plate and the middle guide plate are provided with guide holes through which the probes are inserted at positions shifted between the top guide plate and the middle guide plate so as to lead the probes to be held in a bent state between the top guide plate and the middle guide plate. The probes have a structure easier to bend at a region excluding a maximum stress part than at the maximum stress part defined at a position at which a maximum stress is applied to the probes buckled when tip end parts of the probes are brought into contact with an inspection object.

9 Claims, 7 Drawing Sheets

(56) References Cited

U.S. PATENT DOCUMENTS

| | | | |
|---|---|---|---|
| 2014/0352460 A1* | 12/2014 | Kuo | ................... G01R 1/07357 |
| | | | 73/866.5 |
| 2015/0355235 A1 | 12/2015 | Hsu et al. | |
| 2018/0052190 A1 | 2/2018 | Perego et al. | |
| 2020/0158754 A1* | 5/2020 | Hayashizaki | ...... G01R 1/06761 |

FOREIGN PATENT DOCUMENTS

| | | | | |
|---|---|---|---|---|
| JP | 2015230314 A | | 12/2015 | |
| JP | 2018004260 A | * | 1/2018 | ............. G01R 1/067 |
| JP | 2018004260 A | | 1/2018 | |
| JP | 2018523095 A | | 8/2018 | |
| TW | 200806992 A | | 2/2008 | |

* cited by examiner

ELECTRICAL CONNECTING DEVICE

TECHNICAL FIELD

The present invention relates to an electrical connecting device used for measuring the electrical characteristics of an inspection object.

BACKGROUND ART

To measure the electrical characteristics of an inspection object such as an integrated circuit in a state of not being separated from a wafer, an electrical connecting device is used that includes probes to be brought into contact with the inspection object. The inspection by use of the electrical connecting device of this type is executed such that one ends of the respective probes are brought into contact with the inspection object, while the other ends of the respective probes are brought into contact with electrode pads provided on a printed substrate, for example. The electrode pads are electrically connected to a measurement device such as a tester.

The respective probes are held by a probe head including a guide plate in a state of being inserted through guide holes provided in the guide plate. The probe head typically includes a plurality of guide plates arranged in the axial direction of the probes. For example, the probe head has a structure in which plural guide plates are arranged between the uppermost guide plate and the lowermost guide plate such that the respective probes adjacent to each other are not in contact with each other.

The respective guide plates included in the probe head are provided with guide holes such that the positions of the guide holes are shifted from each other between the respective guide plates so as to hold the probes in an inclined state inside the probe head (refer to Patent Literature 1). This structure leads the probes to be buckled when brought into contact with the inspection object, so as to bring the probes and the inspection object into contact with each other at a stable pressure.

CITATION LIST

Patent Literature

Patent Literature 1: Japanese Unexamined Patent Application Publication No. 2015-118064

SUMMARY OF THE INVENTION

Technical Problem

The side surfaces of the probes tend to be scratched by open parts of the guide holes during the sliding of the probes along the inside of the guide holes when shifted between a state of being in contact with the inspection object and a noncontact state. This causes damage to the probes accordingly.

In response to this issue, the present invention provides an electrical connecting device that can avoid or reduce damage to probes caused during sliding of the probes in guide holes provided in guide plates in a probe head.

Solution to Problem

An aspect of the present invention provides an electrical connecting device including a probe having a tip end part brought into contact with the inspection object during measurement of the inspection object, and a probe head including a top guide plate through which a region adjacent to a proximal end part of the probe penetrates, a bottom guide plate through which a region adjacent to the tip end part of the probe and away from the top guide plate penetrates, and a middle guide plate through which the probe penetrates, the middle guide plate being arranged between the top guide plate and the bottom guide plate and closer to the bottom guide plate. The top guide plate and the middle guide plate are provided with guide holes through which the probe is inserted at positions shifted between the top guide plate and the middle guide plate as viewed in a surface normal direction of a main surface of the top guide plate so as to lead the probe to be held in a bent state between the top guide plate and the middle guide plate. The probe has a structure easier to bend at a region excluding a maximum stress part than at the maximum stress part when the tip end part is brought into contact with the inspection object, the maximum stress part being defined at a position at which a maximum stress is applied to the probe buckled due to the contact of the tip end part with the inspection object.

Advantageous Effects of the Invention

The present invention can provide the electrical connecting device that can avoid or reduce damage to the probes caused during the sliding of the probes along the guide holes provided in the guide plates in the probe head.

DESCRIPTION OF EMBODIMENTS

Figure 1:
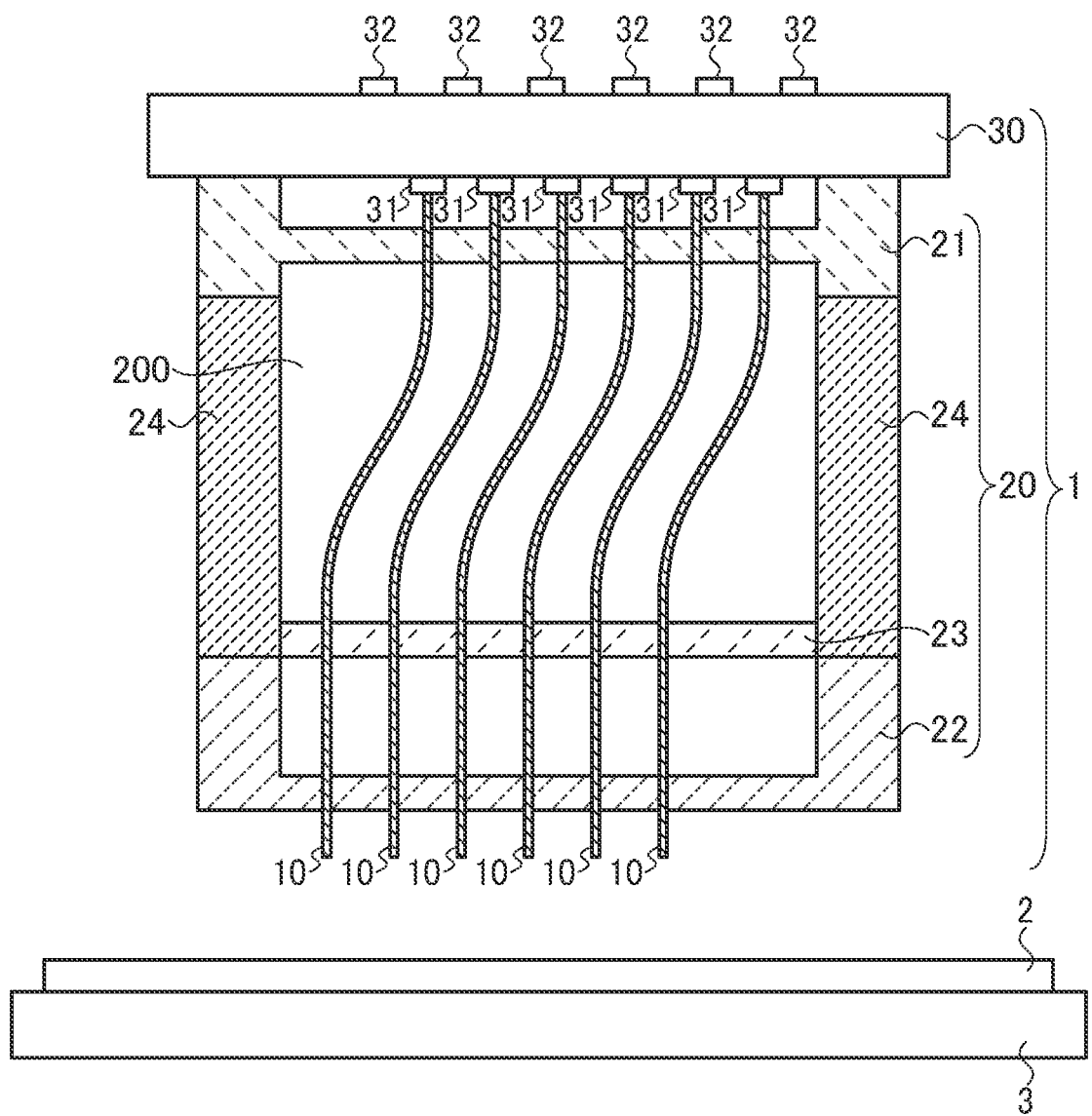
FIG. 1 is a schematic diagram illustrating a structure of an electrical connecting device according to a first embodiment of the present invention.

Embodiments of the present invention are described below with reference to the drawings. The same or similar elements illustrated in the drawings are denoted below by the same or similar reference numerals. It should be understood that the drawings are illustrated schematically, and the proportions of the thicknesses of the respective elements in the drawings are not drawn to scale. It should also be understood that the dimensional relationships or proportions between the respective drawings can differ from each other. The embodiments described below illustrate a device and a method for embodying the technical idea of the present invention, but the respective embodiments are not intended to be limited to the materials, shapes, structures, or arrangements of the constituent elements as described herein.

First Embodiment

An electrical connecting device 1 according to a first embodiment illustrated in FIG. 1 is used for measuring the electrical characteristics of an inspection object 2. The electrical connecting device 1 includes probes 10 and a probe head 20 that holds the probes 10.

Figure 2:
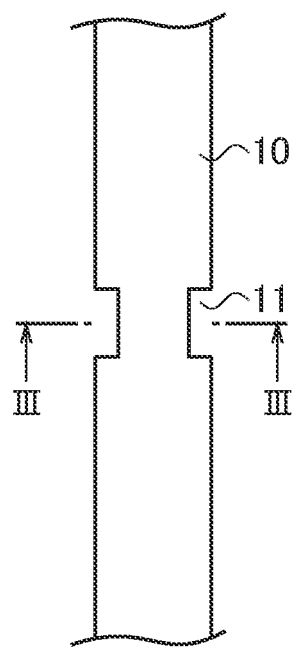
FIG. 2 is a schematic diagram illustrating a structure of a probe in the electrical connecting device according to the first embodiment of the present invention.
Figure 3:
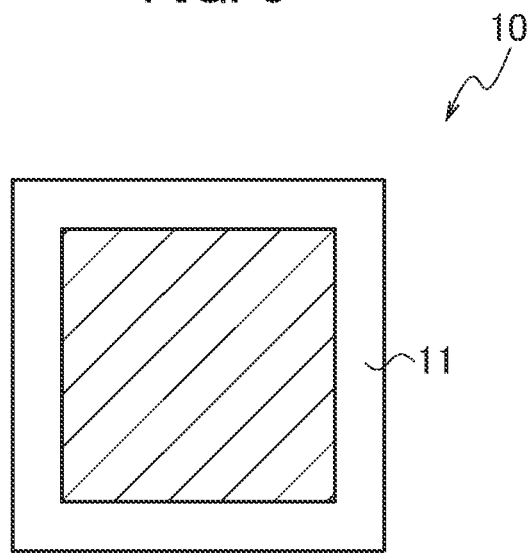
FIG. 3 is a cross-sectional view taken along line in FIG. 2.

Although not illustrated in FIG. 1, the side surface of the respective probes 10 is provided with a narrow part 11, as illustrated in FIG. 2. As illustrated in FIG. 3, the respective probes 10 have a rectangular shape in cross section perpendicular to the axial direction of the probes 10 (referred to below as a "cross-sectional shape"), and the narrow part 11 illustrated in FIG. 3 is provided along the entire circumference of the side surface of the respective probes 10.

The probe head 20 includes a top guide plate through which a region adjacent to a proximal end part of the respective probes 10 penetrates, and a bottom guide plate 22 through which a region adjacent to a tip end part of the respective probes 10 and away from the top guide plate 21 penetrates. A middle guide plate 23 through which the respective probes 10 penetrate is arranged between the top guide plate 21 and the bottom guide plate 22. The top guide plates 21, the bottom guide plate 22, and the middle guide plate 23 are each provided with guide holes not illustrated in FIG. 1 at the positions through which the respective probes 10 penetrate.

The probe head 20 includes a spacer 24 between the outer edge region of the top guide plate 21 and the outer edge region of the bottom guide plate 22 so as to define a hollow region 200 between the top guide plate 21 and the bottom guide plate 22. The plate-shaped middle guide plate 23 is arranged inside the hollow region 200 on the side closer to the bottom guide plate 22.

The positions of the guide holes through which the probes 10 are inserted in the top guide plate 21 are shifted from the positions of the guide holes through which the same probes 10 are inserted in the middle guide plate 23 (referred to below as an "offset arrangement") parallel to the main surface of the top guide plate 21 as viewed in a surface normal direction of the main surface of the top guide plate 21 (referred to below as a "planar view"). The positions of the guide holes in the bottom guide plate 22 and the positions of the guide holes in the middle guide plate 23 substantially conform to each other in the planar view. FIG. 1 illustrates the case in which the respective guide holes in the middle guide plate 23 and the bottom guide plate 22 are shifted toward the left on the sheet of the drawing from the guide holes in the top guide plate 21. The offset arrangement leads the respective probes 10 to be bent by elastic deformation inside the hollow region 200 between the top guide plate 21 and the middle guide plate 23.

During the measurement of the inspection object 2, the tip end parts of the probes 10 exposed on the bottom surface of the bottom guide plate 22 of the probe head 20 are brought into contact with pads for inspection (not illustrated) on the inspection object 2 placed under the electrical connecting device 1. FIG. 1 illustrates a state before the probes 10 are brought in contact with the inspection object 2. The electrical connecting device 1 is a vertical operation-type probe card in which a chuck 3 on which the inspection object 2 is mounted is moved up, for example, so as to bring the tip end parts of the probes 10 into contact with the inspection object 2.

The electrical connecting device 1 illustrated in FIG. 1 further includes an electrode base plate 30. The proximal end parts of the probes 10 projecting from the top surface of the top guide plate 21 of the probe head 20 are connected to electrode pads 31 provided on the bottom surface of the electrode base plate 30 opposed to the probe head 20.

The electrode pads 31 of the electrode base plate 30 are electrically connected to connection pads 32 provided on the top surface of the electrode base plate 30 via wires (not illustrated) arranged inside the electrode base plate 30. The connection pads 32 are electrically connected to an inspecting device such as an IC tester (not illustrated). A predetermined voltage or current is applied to the inspection object 2 by the inspecting device through the probes 10. A signal output from the inspection object 2 is sent to the inspecting device via the respective probes 10 so that the characteristics of the inspection object 2 are inspected.

The offset arrangement between the guide holes in the top guide plate 21 and the guide holes in the middle guide plate 23 causes the probes 10 to be buckled in the hollow region 200 when the tip end parts of the probes 10 with the proximal end parts connected to the electrode pads 31 are brought into contact with the inspection object 2. The probes 10 are greatly bent due to flexural deformation between the top guide plate 21 and the middle guide plate 23. Since the respective probes 10 are held by the middle guide plate 23, the probes 10 adjacent to each other in the hollow region 200 can be prevented from coming into contact with each other.

As described above, the buckling of the probes 10 deforms the probes 10 from the bent shape in the noncontact state before being in contact with the inspection object 2 to the further bent shape in the contact state of being in contact with the inspection object 2 so as to bring the probes 10 into contact with the inspection object 2 at a predetermined pressure. The offset arrangement thus enables the stable measurement of the electrical characteristics of the inspection object 2 by use of the probes 10. After the measurement of the electrical characteristics of the inspection object 2, the probes 10 and the inspection object 2 are led to be in the noncontact state such that the chuck 3 on which the inspection object 2 is mounted is moved down.

The probes 10 have elasticity so as to return to the original state of not being in contact with the inspection object 2 when the probes 10 and the inspection object 2 are led to be in the noncontact state. The probes 10 is made of material such as tungsten (W). Other examples of material used for the probes 10 include a copper (Cu) alloy, a palladium (Pd) alloy, a nickel (Ni) alloy, and a W alloy.

Figure 4:
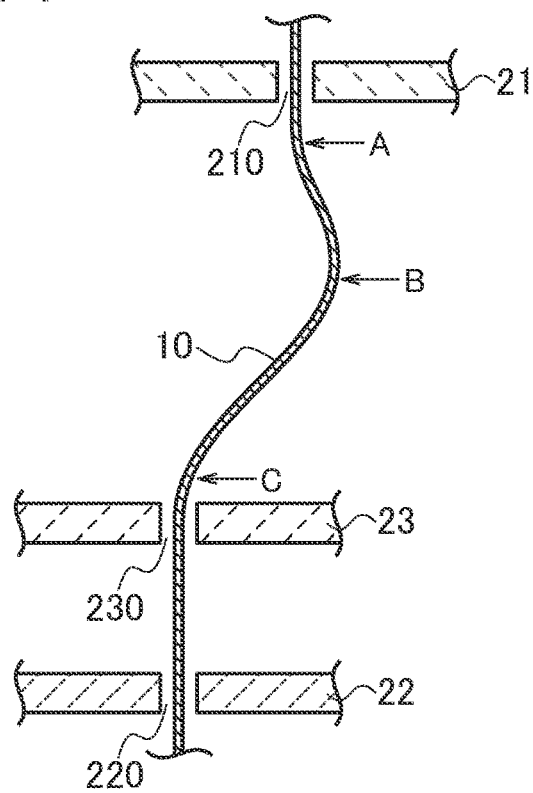
FIG. 4 is a schematic diagram illustrating the probe in a bent state in the electrical connecting device according to the first embodiment of the present invention.

As illustrated in FIG. 4, the respective probes 10 are inserted through the guide holes 210 in the top guide plate 21, the guide holes 230 in the middle guide plate 23, and the guide holes 220 in the bottom guide plate 22 so as to be held by the probe head 20. The probes 10, when brought into contact with the inspection object 2, receives a pressing force from the tip end parts of the probes 10 in the axial direction. At this point, distortion is concentrated in the respective probes 10 at a region A closer to the top guide plate 21, a region B adjacent to the middle between the top guide plate 21 and the middle guide plate 23, and a region C closer to the middle guide plate 23, as illustrated in FIG. 4. A part in the probe 10 to which the maximum stress is applied (referred to below as a "maximum stress part") corresponds to the region B.

The narrow part 11 is located on the side surface of the respective probes 10 in a remaining region other than the maximum stress part in the state in which the probes 10 are into contact with the inspection object 2. The provision of the narrow part 11 in the region other than the maximum stress part leads the position at which the probes 10 are bent most to be shifted toward the proximal end parts (upward on the sheet of the drawing) in the state in which the probes 10 are in contact with the inspection object 2.

Figure 5:
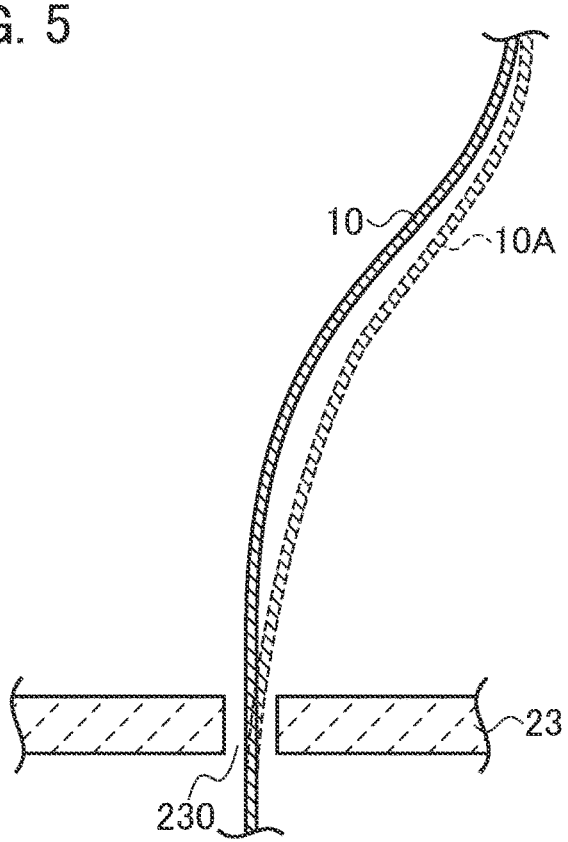
FIG. 5 is a schematic diagram illustrating a buckled state of each of the probe in the electrical connecting device according to the first embodiment of the present invention and a probe of a comparative example.

FIG. 5 illustrates the buckled state of each of the probe 10 in the electrical connecting device 1 according to the first embodiment and a probe 10A of a comparative example not provided with the narrow part 11. As illustrated in FIG. 5, the position at which the probe 10 is bent most is shifted in the direction away from the middle guide plate 23, as compared with the probe 10A of the comparative example indicated by the broken lines.

The probe 10 and the probe 10A each slide inside the guide hole 210 of the top guide plate 21, the guide hole 220 of the bottom guide plate 22, and the guide hole 230 of the middle guide plate 23 when shifted between the state of being in contact with the inspection object 2 and the non-contact state. A distance in which the probe 10 and the probe 10A slide inside the guide hole 210 of the top guide plate 21 is small since the respective proximal end parts are pressed against the electrode pads 31, while a distance in which the probe 10 and the probe 10A slide inside the guide hole 220 of the bottom guide plate 22 or the guide hole 230 of the top guide plate 23 is large.

As illustrated in FIG. 5, the probe 10A of the comparative example is inserted through the guide hole 230 obliquely with respect to the main surface of the middle guide plate 23 because of the influence of distortion of the probe 10A in the region C. The sliding of the probe 10A inside the guide hole 230 of the middle guide 23 causes the side surface of the probe 10A to be scratched by the open part of the guide hole 230. This causes damage to the probe 10A accordingly.

In contrast, as illustrated in FIG. 5, the probe 10 is inserted through the guide hole 230 of the middle guide plate 23 in the direction substantially perpendicular to the main surface of the middle guide plate 23. In other words, the probe 10 slides inside the guide hole 230 substantially parallel to the center line of the guide hole 230. This can avoid or reduce the damage to the side surface of the probe 10 caused by scratches by the open part of the guide hole 230 even when the probe 10 slides inside the guide hole 230.

The narrow part 11 is provided on the respective probes 10 so that the positions at which the buckled probes 10 are bent most are shifted toward the proximal end parts. For example, the dimensions such as the width and the depth of the narrow part 11, and the position and the number of the narrow parts 11 in the respective probes 10 are determined depending on the material used for the probes 10 and the level of the pressure necessary for the stable contact between the pads for inspection on the inspection object 2 or the electrode pads 31 and the probes 10.

For example, the narrow part 11 is provided in the probe 10 so as to be located at a position between the region B and the region C illustrated in FIG. 4. The narrow part 11 may also be provided between the region B and the region A. The plural narrow parts 11 may be provided in the probe 10 along the axial direction.

Figure 6:
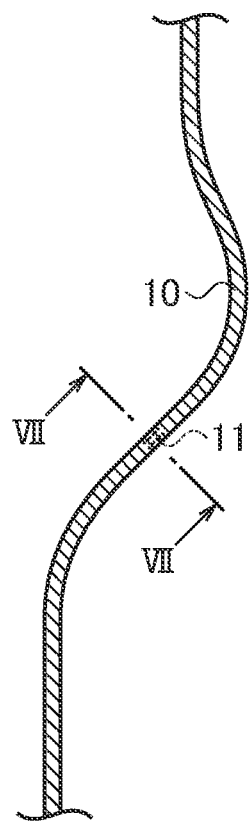
FIG. 6 is a schematic diagram illustrating the buckled state of the probe in the electrical connecting device according to the first embodiment of the present invention.
Figure 7:
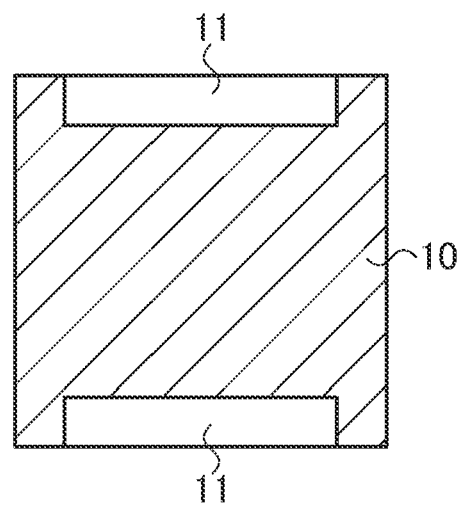
FIG. 7 is a cross-sectional view taken along line VII-VII in FIG. 6.

FIG. 3 illustrates the case in which the narrow part 11 is provided along the entire circumference of the probe 10. The region in the probe 10 provided with the narrow part 11 can be determined as appropriate as long as the probe 10 penetrates substantially parallel to the center line of the guide hole 230 of the middle guide 23. For example, the narrow part 11 may be provided on the surfaces of the probe 10 as illustrated in FIG. 7 stretching and contracting in the axial direction when the probe 10 is buckled as illustrated in FIG. 6. FIG. 7 illustrates the case in which the narrow part 11 is provided on the surfaces of the probe 10 on the upper and lower sides of the sheet of the drawing.

The probes 10 tend to be damaged when the side surfaces of the probes 10 are scratched by the guide holes 230 in the middle guide plate 23 if the middle guide plate 23 is made of material having a high degree of hardness such as ceramic. In view of this, a film made of resin material having a lower degree of hardness than ceramic, for example, is conventionally used for the material for the middle guide plate 23.

However, a film made of resin has a lower heat releasing performance than ceramic to hardly release heat generated in the probes 10. In addition, the use of a soft film easy to deform impedes the positioning of the guide holes, which need to conform to each other in the planar view, between the respective guide plates included in the probe head 20 when the probes 10 are replaced in the probe head 20.

The electrical connecting device 1 according to the first embodiment avoids damage to the side surfaces of the probes 10 due to the scratches by the guide holes 230 of the middle guide plate 23. This allows the use of ceramic as the material for the middle guide plate 23. The use of ceramic facilitates the release of the generated heat from the probes 10. The use of ceramic having a high degree of hardness also facilitates the positioning between the guide holes, improving the efficiency of maintenance of the electrical connecting device 1 accordingly.

The electrical connecting device using the probe 10A of the comparative example further needs to provide a plurality of middle guide plates between the top guide plate 21 and the bottom guide plate 22. The reason for this is that the bent directions of the respective probes should conform to each other so as to avoid the contact between the probes adjacent to each other when the probes having a circular shape in cross section are used.

Figure 8:
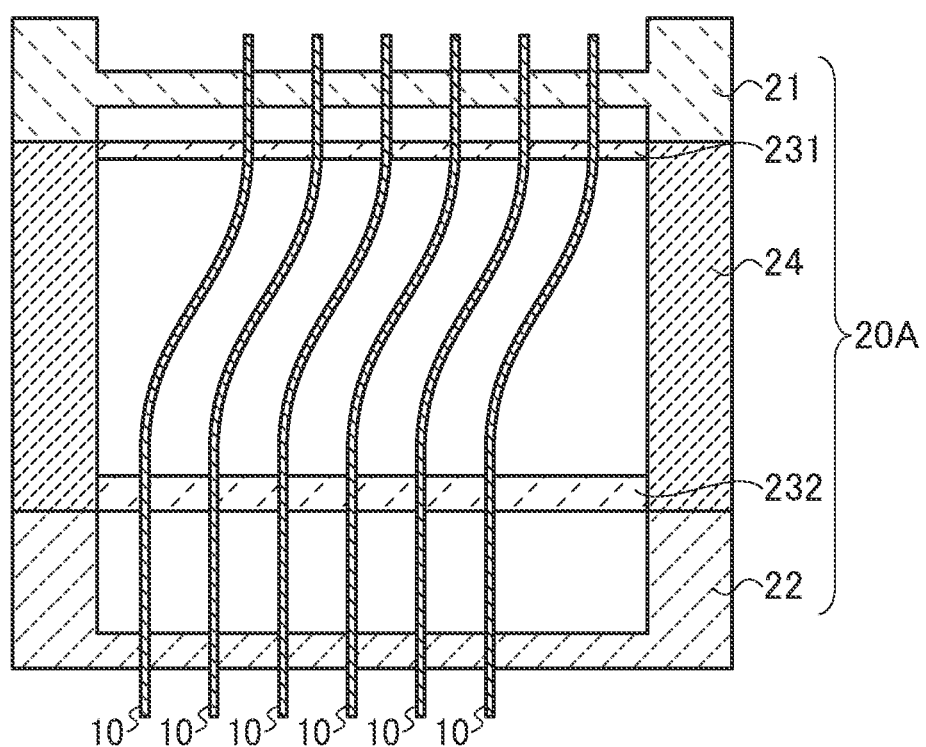
FIG. 8 is a schematic diagram illustrating a structure of a probe head of a comparative example.

For example, as illustrated in FIG. 8, a probe head 20A of the comparative example includes a first middle guide plate 231 arranged closer to the top guide plate 21 and a second middle guide plate 232 arranged closer to the bottom guide plate 22 in the hollow region 200.

In contrast, in the electrical connecting device 1 according to the first embodiment, since the probes 10 have a rectangular shape in cross section, the bent directions of the respective probes 10 held by the probe head 20 conform to each other. This only requires the single middle guide plate 23 to be arranged between the top guide plate 21 and the bottom guide plate 22. The electrical connecting device 1 thus can decrease the number of the middle guide plates to decrease the number of the constituent components used for the probe head 20 accordingly.

As described above, in the electrical connecting device 1 according to the first embodiment of the present invention, the narrow part 11 is formed on the respective probes 10 at a part in the region, excluding the maximum stress part, at which the probes 10 are bent. The narrow part 11 allows the respective probes 10 to slide inside the guide holes 230 of the middle guide plate 23 substantially parallel to the center line of the respective guide holes 230. This prevents a point contact of the probes 10 with the open parts of the guide holes 230. The electrical connecting device 1 as illustrated in FIG. 1 thus can avoid or reduce damage to the probes 10 due to the sliding of the probes 10 in the guide holes provided in the probe head 20.

Modified Example

Figure 9:
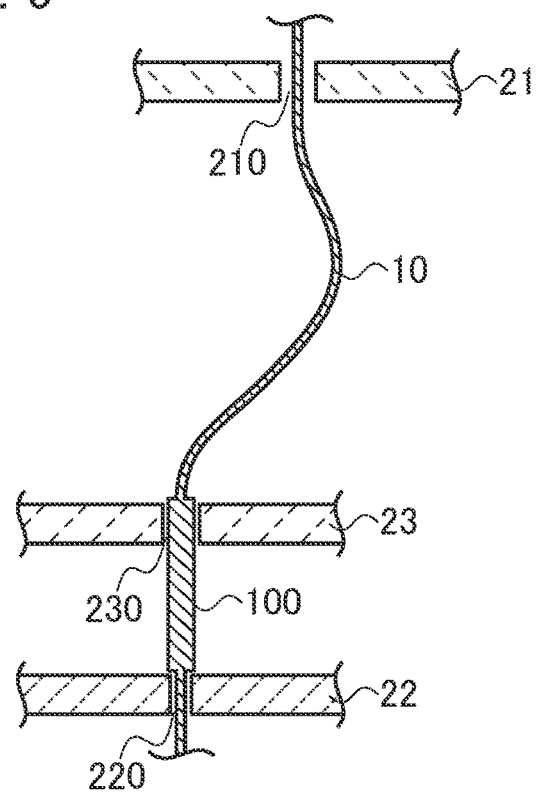
FIG. 9 is a schematic diagram illustrating a structure of an electrical connecting device according to a modified example of the first embodiment of the present invention.

As illustrated in FIG. 9, the respective probes 10 may be provided with a stopper region 100. The stopper region 100 is located closer to the proximal end parts of the probes 10 than the region penetrating through the bottom guide plate 22. The stopper region 100 has an outer diameter greater than an inner diameter of the guide hole 220 of the bottom guide plate 22.

The stopper regions 100 in the probes 10 illustrated in FIG. 9 are brought into contact with the bottom guide plate 22 during the measurement of the inspection object 2. This leads to an application of a preload so as to strongly press the proximal end parts of the probes 10 against the electrode pads 31. The preload enables a stable contact between the probes 10 and the electrode pads 31. The provision of the stopper regions 100 in the probes 10 allows the application of the preload while preventing the tip end parts of the probes 10 from being pressed excessively against the pads for inspection on the inspection object 2.

The stopper regions 100 are prevented from hitting the middle guide plate 23 so as not to impede the sliding of the probes 10. For example, the inner diameter of the guide holes 230 of the middle guide plate 23 may be set to be greater than the outer diameter of the stopper regions 100 so as to allow the stopper regions 100 to slide inside the guide holes 230 of the middle guide plate 23.

FIG. 9 illustrates the probe 10 provided with the stopper region 100 closer to the proximal end part than the region penetrating through the bottom guide plate 22. The arrangement of the stopper region 100 is not limited to the position as illustrated in FIG. 9, and the stopper region 100 may be provided at a position so as to be brought into contact with any of the top guide plate 21, the bottom guide plate 22, and the middle guide plate 23 during the measurement of the inspection object 2. For example, the stopper region 100 may be provided on the probe 10 adjacent to the region penetrating through the top guide plate 21 and closer to the proximal end part than the region penetrating through the top guide plate 21. This arrangement leads the stopper region 100 to be brought into contact with the top guide plate 21 during the measurement of the inspection object 2, so as to stably ensure the preload. Alternatively, the stopper region 100 may be provided on the probe 10 adjacent to the region penetrating through the middle guide plate 23 and closer to the proximal end part than the region penetrating through the middle guide plate 23. This arrangement also leads the stopper region 100 to be brought into contact with the middle guide plate 23 during the measurement of the inspection object 2, so as to stably ensure the preload.

The probes 10 are manufactured through a MEMS process by use of photolithography, plating, and etching. The stopper regions 100 are formed integrally with the bodies of the probes 10 by use of a mask made of glass, for example.

Second Embodiment

The electrical connecting device 1 according to a second embodiment uses the probes 10 having mechanical hardness higher at the maximum stress part than at the other regions excluding the maximum stress part. The probes 10 have a structure easier to bend at the other regions than at the maximum stress part when the tip end parts are brought into contact with the inspection object 2. This structure leads the position bent most in the buckled probes 10 to be shifted toward the proximal end parts, as compared with the case of the probes 10 having the entirely even hardness. The electrical connecting device 1 according to the second embodiment thus allows the probes 10 to slide in the guide holes 230 of the middle guide plate 23 substantially parallel to the center line of the guide holes 230.

The first embodiment is illustrated above with the case of providing the narrow parts 11 on the side surfaces of the probes 10 in the region other than the maximum stress part so as to lead the position bent most in the buckled probes 10 to be shifted toward the proximal end parts. The provision of the narrow parts 11 on the side surface leads the structure of the probes 10 to be bent more easily at the regions excluding the maximum stress part than at the maximum stress part. The second embodiment sets the hardness of the probes 10 to be higher at the maximum stress part than at the other regions so as to facilitate the bending of the probes 10 in the other regions excluding the maximum stress part. The second embodiment thus differs from the first embodiment in the structure of the probes 10 for shifting the position at which the probes 10 are bent most. The other configurations in the electrical connecting device 1 according to the second embodiment are the same as those according to the first embodiment.

Figure 10:
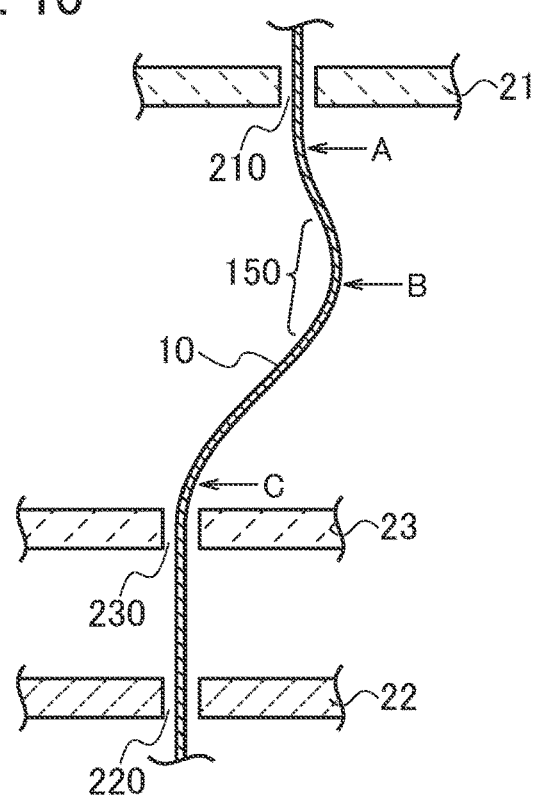
FIG. 10 is a schematic diagram illustrating a structure of a probe in an electrical connecting device according to a second embodiment of the present invention.

The respective probes 10 in the electrical connecting device 1 according to the second embodiment as illustrated in FIG. 10 have the hardness higher in a high hardness region 150 within a predetermined range including the region B that is the maximum stress part than in the other regions in the probe 10. The position at which the probe 10 is bent most as illustrated in FIG. 10 is shifted in the direction away from the middle guide plate 23, as compared with the case in which the probe 10 has the entirely even hardness, in the state in which the respective probes 10 are brought into contact with the inspection object 2. This allows the probes 10 to slide in the guide holes 230 of the middle guide plate 23 substantially parallel to the center line of the guide holes 230. The second embodiment thus can avoid or reduce damage to the side surfaces of the probes 10 caused by scratches by the open parts of the guide holes 230 when the probes 10 slide in the guide holes 230.

Other Embodiments

While the present invention has been described above with reference to the respective embodiments, it should be understood that the present invention is not intended to be limited to the descriptions and the drawings composing part of this disclosure. Various alternative embodiments, examples, and technical applications will be apparent to those skilled in the art according to this disclosure.

Figure 11:
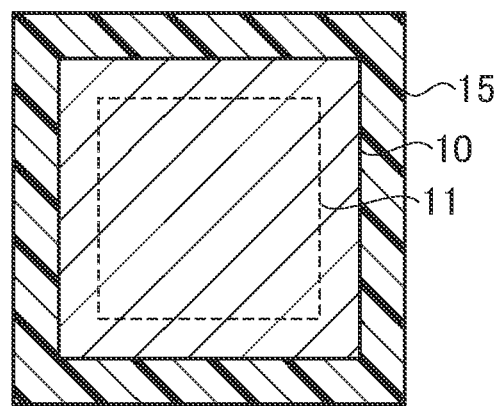
FIG. 11 is a schematic diagram illustrating a structure of a probe in an electrical connecting device according to another embodiment of the present invention.

For example, as illustrated in FIG. 11, the surface of the probe 10 may be coated with an insulating coating material 15. The coating with the insulating coating material 15 can prevent a short circuit between the adjacent probes 10 if coming into contact with each other. The insulating coating material 15 is resin, for example.

It should be understood that the present invention includes various embodiments not disclosed herein. The technical scope of the present invention is defined only by the subject matter according to the claims reasonably derived from the foregoing illustrative descriptions.

What is claimed is:

1. An electrical connecting device used for measuring an electrical characteristic of an inspection object, the device comprising:
   a probe having a tip end part brought into contact with the inspection object during measurement of the inspection object; and
   a probe head including a top guide plate through which a region adjacent to a proximal end part of the probe penetrates, a bottom guide plate through which a region adjacent to the tip end part of the probe and away from the top guide plate penetrates, and a middle guide plate through which the probe penetrates, the middle guide plate being arranged between the top guide plate and the bottom guide plate and closer to the bottom guide plate,
   wherein the top guide plate and the middle guide plate are provided with guide holes through which the probe is inserted at positions shifted between the top guide plate and the middle guide plate as viewed in a surface normal direction of a main surface of the top guide plate so as to lead the probe to be held in a bent state between the top guide plate and the middle guide plate,
   wherein the probe bends into a buckled state when the tip end part is brought into contact with the inspection object, the buckled state associated with buckling at a maximum stress region of the probe, and the maximum stress region located between the top guide plate and the middle guide plate, and
   the probe has a structure located at a bend region other than the maximum stress region, wherein the probe is easier to bend at the bend region than at the maximum stress region when the tip end part is brought into contact with the inspection object, the maximum stress region being defined at a position at which a maximum stress is applied to the probe when buckled due to the contact of the tip end part with the inspection object.

2. The electrical connecting device according to claim 1, wherein a side surface of the probe is provided with a narrow part in the region excluding the maximum stress part between the top guide plate and the middle guide plate.

3. The electrical connecting device according to claim 2, wherein the narrow part is provided along an entire circumference of the probe.

4. The electrical connecting device according to claim 2, wherein the narrow part is provided on a surface of the probe stretching and contracting in an axial direction of the probe when the probe is buckled.

5. The electrical connecting device according to claim 1, wherein the probe has mechanical hardness higher at the maximum stress part than at the region excluding the maximum stress part.

6. The electrical connecting device according to claim 1, wherein the probe has a rectangular shape in cross section perpendicular to an axial direction of the probe.

7. The electrical connecting device according to claim 6, wherein the single middle plate is provided between the top guide plate and the bottom guide plate.

8. The electrical connecting device according to claim 1, wherein:
   the probe is provided with a stopper region having an outer diameter greater than an inner diameter of the guide holes; and
   the stopper region is brought into contact with any of the top guide plate, the bottom guide plate, and the middle guide plate when the tip end part is brought into contact with the inspection object during the measurement of the inspection object.

9. The electrical connecting device according to claim 8, wherein the stopper region having the outer diameter that is greater than the inner diameter of the guide hole of the bottom guide plate is provided closer to the proximal end part of the probe than the region penetrating through the bottom guide plate.

* * * * *